STABILIZED CATHODE RAY-SENSITIVE COATING FILM

Filed June 30, 1972

United States Patent Office 3,801,538
Patented Apr. 2, 1974

3,801,538

STABILIZED CATHODE RAY-SENSITIVE COATING FILM

Hajime Morishita, Tokyo, Takako Hirai, Koganei, and Saburo Nonogaki, Tokyo, Japan, assignors to Hitachi, Ltd., Tokyo, Japan Filed June 30, 1972, Ser. No. 268,110
Claims priority, application Japan, July 2, 1971, 46/48,558
Int. Cl. C08f *45/60*
U.S. Cl. 260—45.9 R 24 Claims

ABSTRACT OF THE DISCLOSURE

A coating film for forming a desired pattern by being exposed to a cathode ray in accordance with the desired pattern, said film being particularly useful as a resist mask in the manufacturing process of an integrated circuit and adapted to be hardened by cathode ray exposure. This coating film is characterized in that it is made of a matrix of an organic polymer having at least three epoxy groups within a molecule, and the polymer matrix contains an electrolyte such as a quaternary alkyl ammonium compound; a halide, hydroxide or carbonate of an alkali metal. The presence of the electrolyte material is effective for keeping the film in a chemically stable state over a long period of time, and also for recording a cathode ray image at high clarity, so that it is very effective for improving the well-known cathode ray-sensitive coating film made of the organic polymer bearing epoxy groups within a molecule.

BACKGROUND OF THE INVENTION

The present invention relates to improvements in a cathode ray-sensitive coating film for forming therein a desired pattern by exposing the film to a cathode ray in accordance with the desired pattern, said coating film being made of a polymer which has at least three epoxy groups within a molecule. More particularly, it relates to a stabilized coating film made with a strong electrolyte material admixed with the polymer matrix as a stabilizer.

As is well known, cathode ray-sensitive coating films are used as materials for replacing photosensitive films and are being put into practical use as, for example, resist mask materials in the manufacturing process of integrated circuits. The resist mask material is broadly classified into the photo-resist utilizing photosensitivity and the cathode ray-resist utilizing cathode ray-sensitivity. Notice has been taken of the cathode ray-sensitive resist in that a resist mask precisely formed is obtained by direct exposure of this resist mask material without using any mask.

The inventors have lately determined that a polymer with a number of epoxy groups within a molecule is useful for the coating film of this type. The polymer, however, is extraordinarily high in its sensitivity to cathode rays. For this reason, in case, e.g., where a desired pattern is drawn with finely confined cathode rays in order to form a cathode ray image of the desired pattern at desired parts of a coating film made of the polymer, not only those portions exposed to the cathode rays but also portions proximate thereto and not directly exposed to the cathode rays are made insoluble to a developer. Consequently, this renders the cathode ray image obscure and sometimes renders a highly precise recording difficult. Moreover, when the coating film is caused to stand for a long period of time, the cross-linking reaction naturally proceeds without exposing the coating at cathode rays thereby making it insoluble to the developer and with the result that the coating is sometimes unusable as a cathode ray-sensitive coating film.

The phenomenon in which the portions of the coating film having no cathode rays irradiated thereon become insoluble as described above, is usually called "spontaneous insolubilization." Although the mechanism that this phenomenon is attributable to is not clear, it is considered the most likely cause is that the large number of epoxy groups contained in the polymer constituting the resist mask material are highly reactive with cathode rays.

SUMMARY OF THE INVENTION

It is an object of the present invention to provide a stabilized cathode ray-sensitive coating film having high sensitivity.

Another object of the present invention is to provide a new and greatly improved cathode ray-resist coating film for use in producing a microcircuit.

In order to accomplish these objects, the inventors introduced various additives into the above-mentioned polymer as stabilizers. From these experiments it has been found that strong electrolytes having some solubility for a solvent of the polymer exhibit particularly excellent effects of preventing or suppressing "spontaneous insolubilization" of the coating. The stabilized cathode ray-sensitive coating film of the present invention is accordingly characterized by consisting essentially of an organic polymer containing a number of epoxy groups within a molecule, and a strong electrolyte having some solubility for a solvent of the polymer and admixed as a stabilizer to the polymer.

Advantageously, it has also been found that the spontaneous insolubilization can be readily prevented without any degradation of the sensitivity of the polymer to cathode rays, and an extremely stabilized cathode ray-sensitive coating film can be obtained.

As the suitable organic polymer containing epoxy groups in accordance with the present invention, one is effective which contains at least three epoxy groups, i.e.,

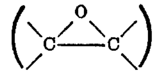

within a molecule and whose molecular weight ranges from 500 to 10,000,000, and more preferably ranges from 100,000 to 2,000,000.

The number of epoxy groups within the molecule exerts an influence directly on the sensitivity of the polymer to cathode rays, and when the number is larger, the sensitivity is higher. In order to hold a practicable sensitivity, it is required that the organic polymer bears at least three epoxy groups within the molecule as stated above. On the other hand, the molecular weight is also associated with the number of epoxy groups, and in general, it is increased with the number. Accordingly, a high molecular weight is to some extent more preferable. Increase in the molecular weight, however, lowers the resolution, and renders the polymer poorly soluble in a solvent at formation of the coating film. Therefore, the molecular weight is inevitably regulated to such extent that the polymer will be dissolved in the solvent. In contrast, if the molecular weight is too small, it is difficult to form a preferable coating film, and in addition, the sensitivity to cathode rays is lowered. For these reasons, the molecular weight of the polymer applied to the present invention is effectively from 500 to 10,000,000. Suitable polymers containing a numebr of epoxy groups, are exemplified below. All these polymers are high in the sensitivity to cathode rays, and often cause the "spontaneous insolubilization" phenomenon.

Among the suitable polymers are epoxidized cis 1,4-polybutadiene; epoxidized cis 1,4-polyisoprene; epoxidized cis 1,4-polychloroprene; epoxidized 1,2-polybutadiene; or a polymer obtained from a vinyl compound having an epoxy group as set forth below which is preferably singly polymerized (i.e., homopolymerized) via a vinyl radical:

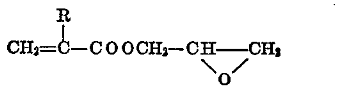

where R denotes H, $CH_3$ or Cl;

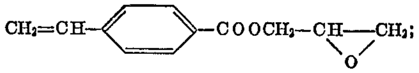

and

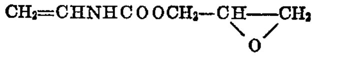

The double bonds of the polydienes are preferably epoxidized to a degree of from 10 to 60% and in some cases the degree of epoxidation may be 100%.

Further, copolymers or cocondensates between these vinyl compounds and other polymerizable substances, e.g., methyl acrylate, ethyl methacrylate, vinyl acetate, vinyl chloride, styrene, α-methyl styrene, and methyl vinyl ketone, the molar ratio of these additional monomers being from 0.1 to 4; or an epoxy-containing product, such as an epoxy phenol resin in which a hydroxyl group in a polymer, e.g., a phenolic resin, is caused to react with an epoxy compound (e.g., glycidyl ethers of phenol-formaldehyde resins).

As the stabilizers for preventing the spontaneous insolubilization for use in the present invention, there can be mentioned the following strong electrolytes:

Halides, such as iodides, bromides and chlorides, of alkali metals such as lithium, sodium, potassium, rubidium and cesium, or hydroxides or carbonates of these metals; halides or hydroxides of alkaline earth metals such as magnesium, calcium, strontium and barium; alkyl trimethyl ammonium halide, alkyl triethyl ammonium halide, alkyl trimethyl ammonium hydroxide and alkyl triethyl ammonium hydroxide, and quaternary alkyl ammonium compounds, such as trimethyl benzyl ammonium iodide, trimethyl benzyl ammonium hydroxide and trimethyl lauryl ammonium chloride, which quaternary compounds can be represented by the general formula:

$$\left[ R_2-\overset{R_1}{\underset{R_3}{N^{+}}}-R_4 \right] X^-$$

wherein $R_1$, $R_2$ and $R_3$ represent a methyl group or a ethyl group, $R_4$ represents an alkyl group containing from 4 to 18 carbon atoms, such as a butyl group, a benzyl group, a lauryl group and a stearyl group; and X represents a halogen such as iodine, chlorine and bromine, or a hydroxyl group. Properties required for the stabilizer electrolytes are as below. Since a cathode ray-sensitive coating film is usually formed in such a way that the organic polymer having a number of epoxy groups within a molecule is dissolved in an organic solvent and the resulting coating solution is adjusted, the electrolyte should be dissolved in the solvent even slightly. In addition, when the coating film is formed, the electrolyte should be dispersed or dissolved therein.

The method of adding the stabilizer to the organic polymer will now be further described. The stabilizer may be dissolved in an organic solvent previous to dissolving the organic polymer in the solvent. It may also be dissolved simultaneously with the polymer. In addition, it may be dissolved in a solution in which the polymer has been previously dissolved. With any of these methods, substantially equal effects are attained. It is important that upon addition, the additive is sufficiently dissolved so as not to exist as solid in the solution. Even at a slight amount of addition, the stabilizer exhibits an effect corresponding to the amount added. In general, the effect of the stabilizer is more pronounced as the amount of addition is larger. When added in too large amounts, the stabilizer additive is sometimes precipitated on the coating film, and hence, the amount of addition is required to be restricted to such extent that such precipitation is not effected. When the stabilizer is precipitated on the coating film, it becomes a cause for generating pin holes in the coating film and also causes degradation in the degree of preciseness in etching. This precipitation should be therefore avoided.

As stated previously, as the number of epoxy groups is larger, that is, in general as the molecular weight is larger, the epoxy group-containing polymer is higher in the sensitivity to cathode rays, and hence, the spontaneous insolubilization phenomenon occurs more easily. It is, accordingly, desirable in practice to determine the amount of addition of the stabilizer in dependence on the molecular weight and the number of epoxy groups of the polymer used. In general, the practical amount of stabilizer addition is from 0.1 to 5% by weight based on the weight of the polymer.

If the coating film of the present invention is used as, e.g., a cathode ray-resist film in manufacturing a photomask for producing a semiconductor element or a resist mask for producing other microcircuits, a mask of an extremely high accuracy of finish can be made. If the surface of the coating film of the present invention is directly scanned by cathode rays without a mask, a cathode ray image of a desired configuration which is extremely high in the accuracy of finishing can be formed. Thus, the coating film can be put into practical use in place of the prior-art photo-etching process in the field of semiconductor engineering. In addition, the coating film of the present invention can be satisfactorily used as a material for recording a fine pattern, for recording a high density picture, and for recording cathode ray holography.

Figure 1:
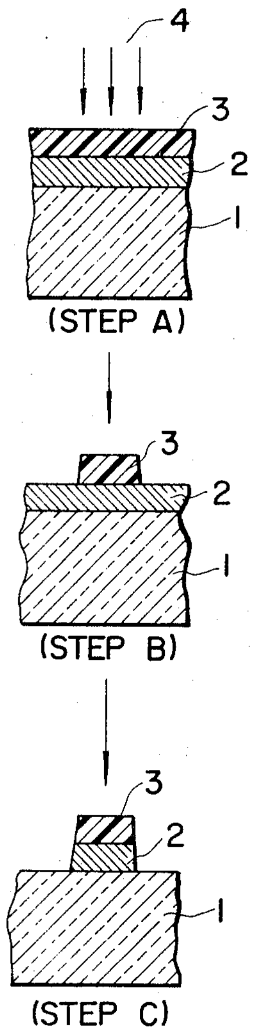
FIG. 1 shows diagrams of the manufacturing steps of the present invention for preparing a cathode ray-sensitive coating film useful as a resist film.

In the drawing, Step (A) is a cathode ray exposure step, Step (B) a developing step and Step (C) an etching step. Reference numeral 1 designates a glass substrate, 2 a metal vaporized film, 3 a cathode ray-sensitive coating film and 4 cathode rays.

DESCRIPTION OF THE PREFERRED EMBODIMENTS

The embodiment of the invention where the cathode ray-sensitive coating film is used as a cathode ray-resist material is described with reference to the drawing.

As illustrated at Step (A), the metal vaporized film 2 is formed on the glass substrate 1. The cathode ray-sensitive coating film 3 is formed on the metal vaporized film 2. The cathode rays 4 are irradiated on a part of the coating film 3 by a suitable amount, whereupon the coating film 3 is treated with an appropriate organic solvent (developer). Then, a portion of the coating film which has not been exposed to the cathode rays is dissolved and removed, while the coating film only at that portion at which insolubilization has occurred due to the exposure to the cathode rays remains without being dissolved in the solvent. Thus, the state or condition shown at Step (B) is obtained. The layers in this state are further treated with known and conventional chemicals which etch the metal vaporized film 2. Then only the portion of the metal vaporized film on which the coating film 3 partially remains is left, while the metal vaporized film at the other portion is dissolved and removed, to thereby obtain a state shown at Step (C). In this way, a glass plate can be obtained in which the metal vaporized film remains only at the part exposed to the cathode rays. If a predetermined pattern is depicted on the polymer coating film with the cathode rays during the exposure thereof, the metal vaporized film conforming to the pattern depicted by the cathode rays is left on the glass substrate after the etching step for the metal vaporized film. Using a cathode ray-depicting device and the cathode ray-resist in this manner, even a complicated and fine pattern can be finished at an extremely high precision, and a metal vaporized film of any desired design can be formed.

When the stabilized cathode ray-sensitive coating film of the present invention was applied to the cathode ray-resist, resist masks finished at high accuracy could be produced in all the cases, with the results that the metal layer could be etched at excellent precision (this will also become apparent from examples hereinafter presented).

In contrast, when the coating film which was made only of the polymer having a number of epoxy groups within a molecule and lacked the improvements by the present invention was used as the resist material, good results were not always achieved. More specifically, it has been revealed that, when the unimproved coaitng film is actually used as the cathode ray-resist in accordance with the steps (A) to (C) of the process shown in the drawing, the phenomenon in which the coating film is somewhat insolubilized to the developer can occur not only at the part or portion having been exposed to the cathode rays, but also at the part or portion that being proximate thereto and that is not exposed to the cathode rays. That is to say, in case, for example, where the cathode rays are irradiated on a desired portion of the coating film 3 at Step (A) and thereafter the developing treatment is conducted with the developer (organic solvent) so as to obtain the layered structure in the state of Step (B), a very thin coating film 3 can also be left on that surface of the metal vaporized film 2 which corresponds to the coating film portion that has not been exposed to the cathode rays. At the etching step for the metal film 2, this remaining coating film retards the etching of the metal film at parts which ought to be etched. This is an extremely serious problem in the field of the semiconductor device industry which requires precise finishing, and particularly in the field in which a high accuracy of finishing is required for a complicated microcircuit as in an integrated circuit. It is therefore required to carry out a treatment in which this remaining film is not produced.

In this regard, the coating film improved by the present invention is high in resolution, and can accordingly form a highly accurate resist mask, with the result that highly precise finishing of a metal film is attained.

The invention will be further understood by reference to the following examples.

In all the following examples, the extent of the spontaneous insolubilization of the coating film is indicated by the soluble property of the coating film for the solvent after it has been caused to stand for a predetermined period of time. The prior-art coating film which does not contain the stabilizer of the present invention causes the spontaneous insolubilization in each case. The effect of stability is accordingly indicated by the extent of the insolubilization.

EXAMPLE 1

In a 3–5% cyclohexanone solution of epoxidized cis 1,4-polybutadiene (this polydiene has epoxidization degree of 20–40% and a molecular weight of approximately 300,000), 1–3% by weight of potassium iodide based on the weight of the epoxidized cis 1,4-polybutadiene was dissolved. The cyclohexanone solution thus prepared was coated on the surface of a chromium vaporized film on a glass substrate separately prepared beforehand, and was dried to form a coating film. Even when the coating film was allowed to stand at the room temperature for 24 hours, it could be dissolved and removed by cyclohexanone, and produced no insolubilized portion As an example for comparison, a coating film was formed in a similar manner but without the addition of potassium iodide. After this film was allowed to stand at the room temperature for 24 hours, an attempt was made to dissolve and to remove the film with cyclohexanone. However, the film was completely insolubilized, and lost the property of being dissolved in cyclohexanone.

EXAMPLE 2

In a 3–5% cyclohexanone solution of epoxidized cis 1,4-polyisoprene (this polydiene has an epoxidization degree of 100%, and a molecular weight of approximately 300,000), 1–3% by weight of potassium iodide based on the amount of epoxidized cis 1,4-polyisoprene was dissolved. The solution thus prepared was coated on the surface of a chromium vaporized film on a glass substrate, and was dried to form a coating film. Even when the coating film was allowed to stand at the room temperature for 24 hours, it could be easily dissolved and removed by cyclohexanone, and no insolubilized portion was produced. In contrast, a coating film of the same polymer for comparison with no potassium iodide added thereto was insolubilized, and was not dissolved in cyclohexanone.

EXAMPLE 3

In a 2–5% monochlorobenzene solution of epoxidized cis 1,4-polybutadiene having a epoxidization degree of 54% and a molecular weight of 300,000 Catiolite BC containing a quaternary alkyl ammonium salt as its principal agent (Catiolite BC: trade name, Kyoeisha Yushi Kagaku Kogyo Kabushiki Kaisha, the salt constituent being trimethyl lauryl ammonium chloride) was dissolved to provide 0.5–2% by weight of the chloride with respect to the amount of epoxidized cis 1,4-polybutadiene. The solution thus prepared was coated on a chromium vaporized film on a glass substrate, and was dried to form a coating film. Even after being caused to stand at the room temperature for 24 hours, the coating film could be dissolved by cyclohexanone, and did not produce any insolubilized portion.

EXAMPLE 4

To a 2.8% cyclohexanone solution of epoxidized cis 1,4-polybutadiene having epoxidization degree of 55% and a molecular weight of approximately 300,000, 1.3% by weight of cesium iodide based on the amount of epoxidized cis 1,4-polybutadiene was added. The solution with the cesium iodide dissolved therein was coated on the surface of a chromium vaporized film on a glass substrate, and was dried. The coating film thus formed was caused to stand at the room temperature for 24 hours. Even after this prolonged period the film could be easily dissolved and removed by cyclohexanone, and exhibited no insolubilized portion. In contrast, a sample of the cyclohexanone solution chosen for comparison to which no cesium iodide was added was formed into a film and allowed to stand for 24 hours. This film could not be completely dissolved and removed by cyclohexanone, and left a clear insolubilized coating.

EXAMPLE 5

To the same kind of cyclohexanone solution of epoxidized cis 1,4-polybutadiene used in Example 4, 1.6% by weight of trimethyl benzyl ammonium iodide based on the weight of the epoxidized cis 1,4-polybutadiene was added. The solution obtained by dissolving the stabilizer was coated on the surface of a chromium vaporized film on a glass substrate, and was dried. The coating film thus formed was caused to stand at room temperature for 24 hours. Even then, it could be easily dissolved and removed by cyclohexanone, and no insolubilized portion was produced.

EXAMPLE 6

To the same kind of cyclohexanone solution of epoxidized cis 1,4-polybutadiene used in Example 4, a 5% aqueous solution of sodium carbonate was added in an amount to 18% by weight of the carbonate on the basis of the amount of epoxidized cis 1,4-polybutadiene. Both the solutions were well agitated together. The solution thus prepared did not become perfectly uniform, and part of the sodium carbonate was precipitated in the solution. The solution with the precipitate removed therefrom was coated on the surface of a chromium vaporized film on a glass substrate, and was dried to form a coating film. Even after the coating film was caused to stand at the room temperature for 24 hours, it was substantially dissolved in cyclohexanone and left only a very slight insolubilized film.

EXAMPLE 7

To the same kind of cyclohexanone solution of epoxydized cis 1,4-polybutadiene used in Example 4, a saturated solution of barium hydroxide was added in an amount to provide 1.5% by weight of the hydroxide with respect to the weight of the epoxidized cis 1,4-polybutadiene. Both the solutions were agitated well. The solution thus prepared did not become completely uniform, and a very small amount of precipitate was produced. The solution with the precipitate removed therefrom was coated on a chromium vaporized film on a glass substrate, and was dried to form a coating film. Even after the coating film was caused to stand at the room temperature for 24 hours, the coating dissolved in cyclohexanone nearly perfectly, and left only a very slight insolubilized film.

EXAMPLE 8

On an $SiO_2$ film formed on a silicon substrate, the coating film of the present invention was formed by using the same type of polymer solution described in the Example 1. An electron beam at an accelerating voltage of 15 kv. was bombarded on the coating film by an amount of irradiation of $2\times10^{-8}$ coulomb/cm.$^2$. Thereafter, development was carried out such that the coating film at the non-irradiation portions was dissolved by washing the film with cyclohexanone. The layered structure which had the developed surface thus obtained, was heat-treated at 110° C. for one hour. Thereafter, the layered structure with the developed surface was immersed for 10 minutes in a mixed solution consisting of a 46% aqueous solution of HF and 141% aqueous solution of $NH_4F$ (the mixing ratio being 1:6), whereby the $SiO_2$ film at the portions corresponding to the dissolved and removed portions of the coating film was removed by etching. Subsequently, the coating film covered on the remaining $SiO_2$ film was removed. Thus, a silicon wafer having the $SiO_2$ film only at the desired parts of the silicon substrate was obtained.

EXAMPLE 9

In a manner similar to the procedure set forth in Example 3, the coating film of the present invention was formed on a chromium vaporized film on a glass substrate. An electron beam at an accelerating voltage of 120 kv. was bombarded on the coating film by an amount of irradiation of $10^{-9}$ coulomb/cm.$^2$. Thereafter, development was carried out such that the coating film was washed with cyclohexanone to thereby dissolve non-irradiation portions thereof. The layered structure which had the developed surface thus obtained, was heat-treated at 110° C. for one hour. Thereafter, the layered structure with the developed surface was immersed in a mixed solution consisting of potassium ferricyanide and sodium hydroxide, whereby the chromium film at the portions corresponding to the removed portions of the coating film was removed. Subsequently, the coating film covered on the remaining chromium film was removed. Thus, the glass substrate having the chromium film only at its desired portions was obtained.

EXAMPLE 10

In addition to the foregoing examples, experiments were also made using such strong electrolytes as sodium chloride, sodium hydroxide, potassium hydroxide, calcium hydroxide and trimethyl benzyl ammonium hydroxide with an epoxy-containing polymer including the homopolymers prepared from vinyl monomer heretofore described. In each case, substantially equal effects to those in the foregoing examples were noted. As previously stated, it has been revealed that any strong electrolyte which is even slightly dissolved in an organic solvent for the polymer can be used as the stabilizer in the present invention.

In the field of semiconductor engineering, mixing of metal ions is generally not preferred since they become impurities. Therefore, when the present invention is used for a resist mask material, used in preparing semiconductor nonmetal compounds such as quaternary alkyl ammonium compounds are preferable.

It will be appreciated that the conditions of electron-beam exposure, development and heat treatment in the above examples are representative of the conventional practices used in the formation of electron beam resists. Also it will be understood that the suitable solvents to be used in preparing and developing the coating are cyclohexanone, monochlorobenzene, xylene toluene, benzene, methyl isobutyl ketone and methyl ethyl ketone and that suitable concentration of the polymer in solution ranges from 1 to 5% depending mainly on the molecular weight of the polymers and the conditions used for coating.

While the novel principles of the invention have been described, it will be understood that various omissions, modifications and changes in these principles may be made by one skilled in the art without departing from the spirit and scope of the invention.

What we claim is:

1. A stabilized cathode ray-sensitive coating film for forming a desired pattern upon exposure to a cathode ray in accordance with the desired pattern, said coating film consisting essentially of a film-forming organic polymer having at least three epoxy groups per molecule and ranging in the molecular weight range from 500 to 10,000,000, and as a strong electrolyte material admixed within the polymer, one of the halides of an alkali metal.

2. A stabilized cathode ray-sensitive coating film according to claim 1, wherein said halide of an alkali metal is selected from the group consisting of potassium iodide and cesium iodide.

3. A stabilized cathode ray-sensitive coating film for forming a desired pattern upon exposure to a cathode ray in accordance with the desired pattern, said coating film consisting essentially of a film-forming organic polymer having at least three epoxy groups per molecule and ranging in molecular weight from 500 to 10,000,000, and a strong electrolyte material admixed within the polymer, said strong electrolyte material being selected from at least one member of the group consisting of halides of alkali metals, carbonates of alkali metals; halides of alkaline earth metals; hydroxides of alkaline earth metals; and quaternary alkyl ammonium compounds represented by the following general formula:

$$\left[\begin{array}{c} R_1 \\ | \\ R_2-N^{+}-R_4 \\ | \\ R_3 \end{array}\right]X^-$$

wherein $R_1$, $R_2$ and $R_3$ are, each selected from the group consisting of a methyl group and an ethyl group; $R_4$ is selected from alkyl groups of $C_{4-18}$ a benzyl group, a lauryl group, and a stearyl group; and X is selected from the group consisting of the halogens and a hydroxyl group.

4. A stabilized cathode ray-sensitive coating film according to claim 3, wherein said film-forming organic polymer is selected from the group consisting of epoxidized cis 1,4-polybutadiene; epoxidized cis 1,4-polyisoprene; epoxidized cis 1,4-polychloroprene; epoxidized cis 1,2-polybutadiene; and a polymer obtained by polymerization of a vinyl compound selected from the group consisting of:

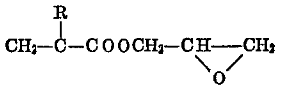

where R denotes hydrogen, a methyl group or chlorine;

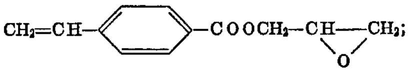

and

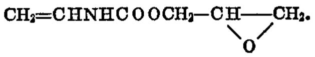

5. A stabilized cathode ray-sensitive coating film according to claim 3, wherein said strong electrolyte material is one of the halides of an alkali metal.

6. A stabilized cathode ray-sensitive coating film according to claim 3, wherein said strong electrolyte material is one of the quaternary alkyl ammonia compounds represented by the following general formula:

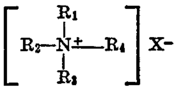

wherein each $R_1$, $R_2$ and $R_3$ are each selected from the group consisting of a methyl group and an ethyl group; $R_4$ is selected from the group consisting of a benzyl group, a lauryl group, and a stearyl group an alkyl group of $C_{4-18}$, and X is selected from the group consisting of a halogen and a hydroxyl group.

7. A stabilized cathode ray-sensitive coating film according to claim 6, wherein each of $R_1$, $R_2$ and $R_3$ is a methyl group; $R_4$ is one member selected from the group consisting of a butyl group, a benzyl group, a lauryl group and a stearyl group; and X is one member selected from the group consisting of iodine, chlorine, bromine and a hydroxyl group.

8. A stabilized cathode ray-sensitive coating film according to claim 4, wherein the double bonds of the polydienes are epoxidized to a degree of from 10 to 100%.

9. A stabilized cathode ray-sensitive coating film according to claim 8, wherein said polydienes are epoxidized to a degree of from 10 to 60%.

10. The stabilized cathode ray-sensitive coating film according to claim 6, wherein said quaternary alkyl ammonium compound is trimethyl benzyl ammonium iodide.

11. The stabilized cathode ray-sensitive coating film according to claim 3, wherein said strong electrolyte material is at least one alkali metal carbonate.

12. The stabilized cathode ray-sensitive coating film according to claim 6, wherein X is hydroxyl group.

13. The stabilized cathode ray-sensitive coating film according to claim 6, wherein X is halogen.

14. The stabilized cathode ray-sensitive coating film according to claim 13, wherein the halogen is iodine.

15. The stabilized cathode ray-sensitive coating film according to claim 13, wherein the halogen is chlorine.

16. The stabilized cathode ray-sensitive coating film according to claim 13,, wherein the halogen is bromine.

17. A stabilized cathode ray-sensitive coating film according to claim 3, wherein the amount of said strong electrolyte material admixed in the organic polymer matrix is allowed up to a maximum amount at which the strong electrolyte material can be uniformly dispersed or dissolved in said matrix without being precipitated on a surface of said coating film.

18. A stabilized cathode ray-sensitive coating film according to claim 3, wherein said strong electrolyte is a halide of an alkaline earth metal.

19. A stabilized cathode ray-sensitive coating film according to claim 3, wherein said strong electrolyte material is a hydroxide of an alkaline earth metal.

20. A stabilized cathode ray-sensitive coating film according to claim 3, wherein said strong electrolyte is trimethy lauryl ammonium chloride.

21. A stabilized cathode ray-sensitive coating film according to claim 3, wherein said strong electrolyte is barium hydroxide.

22. A stabilized cathode ray-sensitive coating film according to claim 3, wherein, the strong electrolyte is present in an amount from 0.1 to 5% by weight based on the weight of the polymer.

23. A stabilized cathode ray-sensitive coating film according to claim 3, wherein the strong electrolyte is present in an amount effective to prevent spontaneous insolubilization.

24. A stabilized cathode ray-sensitive coating film according to claim 3, wherein said film exhibits high resolution.

References Cited

UNITED STATES PATENTS

| | | | |
|---|---|---|---|
| 2,949,441 | 8/1960 | Newey | 260—94.7 A |
| 2,959,531 | 11/1960 | Wheelock | 260—94.7 A |

MAURICE J. WELSH, Primary Examiner

U.S. Cl. X.R.

117—93.31; 204—159.14, 159.18; 260—45.7 R, 23 EP, 23.7 R, 88.3 A, 92.3, 94.7 A